(12) United States Patent
Stössel et al.

(10) Patent No.: US 7,989,071 B2
(45) Date of Patent: Aug. 2, 2011

(54) ORGANIC ELECTRONIC DEVICES

(75) Inventors: Philipp Stössel, Frankfurt (DE); Anja Gerhard, Veitschöchheim (DE); Horst Vestweber, Gilserberg (DE)

(73) Assignee: Merck Patent GmbH (DE)

( * ) Notice: Subject to any disclaimer, the term of this patent is extended or adjusted under 35 U.S.C. 154(b) by 903 days.

(21) Appl. No.: 11/587,702

(22) PCT Filed: May 3, 2005

(86) PCT No.: PCT/EP2005/004803
§ 371 (c)(1),
(2), (4) Date: Oct. 26, 2006

(87) PCT Pub. No.: WO2005/109540
PCT Pub. Date: Nov. 17, 2005

(65) Prior Publication Data
US 2008/0026229 A1    Jan. 31, 2008

(30) Foreign Application Priority Data
May 4, 2004    (DE) .......................... 10 2004 021 989

(51) Int. Cl.
*H01L 51/30* (2006.01)
*H01L 51/05* (2006.01)
*H01L 51/00* (2006.01)
*H01L 51/50* (2006.01)
*H01L 51/52* (2006.01)

(52) U.S. Cl. ............... 428/423.1; 428/411.1; 428/474.4; 428/480; 428/500; 428/532

(58) Field of Classification Search ............... 428/423.1, 428/411.1, 474.4, 480, 500, 532
See application file for complete search history.

(56) References Cited

U.S. PATENT DOCUMENTS

| | | | |
|---|---|---|---|
| 3,941,901 | A | 3/1976 | Harsch |
| 4,539,507 | A | 9/1985 | VanSlyke et al. |
| 5,151,629 | A | 9/1992 | VanSlyke |
| 5,596,208 | A | 1/1997 | Dodabalapur et al. |
| 5,705,826 | A | 1/1998 | Aratani et al. |
| 5,840,217 | A | 11/1998 | Lupo et al. |
| 5,885,368 | A | 3/1999 | Lupo et al. |
| 5,935,752 | A | 8/1999 | Ueda et al. |
| 6,211,369 | B1 | 4/2001 | Salbeck et al. |
| 6,335,480 | B1 | 1/2002 | Bach et al. |
| 6,458,909 | B1 | 10/2002 | Spreitzer et al. |
| 6,476,265 | B1 | 11/2002 | Spreitzer et al. |
| 7,049,010 | B1 | 5/2006 | Holmes et al. |
| 7,223,483 | B2 | 5/2007 | Shirane et al. |
| 7,432,525 | B2 | 10/2008 | Mizusaki et al. |
| 2002/0098377 | A1 | 7/2002 | Cao et al. |
| 2003/0116270 | A1 | 6/2003 | Hawa et al. |
| 2003/0181694 | A1 | 9/2003 | Shirane et al. |
| 2004/0254388 | A1 | 12/2004 | Spreitzer et al. |
| 2006/0063027 | A1 | 3/2006 | Vestweber et al. |

FOREIGN PATENT DOCUMENTS

| | | |
|---|---|---|
| CA | 2 065 500 | 10/1993 |
| EP | 0 423 283 | 4/1991 |
| EP | 0 564 676 | 10/1993 |
| EP | 0 676 461 | 10/1995 |
| EP | 0 850 492 | 7/1998 |
| EP | 0 968 175 | 1/2000 |
| GB | 2 357 180 | 6/2001 |
| JP | 2001-520300 | 10/2001 |
| JP | 2002-265610 | 9/2002 |
| JP | 2002-324401 | 11/2002 |
| JP | 2003-003165 | 1/2003 |
| JP | 2003-142271 | 5/2003 |
| JP | 2003-243175 | 8/2003 |
| JP | 2003-249367 | 9/2003 |
| JP | 2003-313546 | 11/2003 |
| WO | WO-94/05045 | 3/1994 |
| WO | WO-95/31833 | 11/1995 |
| WO | WO-98/03566 | 1/1998 |
| WO | WO-98/27136 | 6/1998 |
| WO | WO-98/48433 | 10/1998 |
| WO | WO-99/10939 | 3/1999 |
| WO | WO-99/12888 | 3/1999 |
| WO | WO-00/42668 | 7/2000 |
| WO | WO-02/10093 | 2/2002 |
| WO | WO-2003/050201 | 6/2003 |
| WO | WO-03/056640 | 7/2003 |
| WO | WO-2004/058911 | 7/2004 |
| WO | WO-2005/003253 | 1/2005 |

OTHER PUBLICATIONS

Atsushi Ikeda et al.,"Efficient Photocurrent Generation in Novel Self-Assembled Multilayers Comprised of [60]Fullerene-Cationic Homooxacalix[3]arene Inclusion Complex and Anionic Porphyrin Polymer," *J. Am. Chem. Soc.*, 2001, 123, pp. 4855-4856.

Atsushi Ikeda, et al. "Efficient Photocurrent Generation in Novel Self-Assembled Multilayers Comprised of [60]Fullerene-Cationic Homooxacalix[3]arene Inclusion Complex and Anionic Porphyrin Polymer," *J. Am. Chem. Soc.*, 2001, 123, pp. 4855-4856.

*Primary Examiner* — Duc Truong
(74) *Attorney, Agent, or Firm* — Connolly Bove Lodge & Hutz LLP

(57) ABSTRACT

The invention relates to the improvement of organic electronic devices, especially organic electroluminescence devices, to which end inclusion compounds are used, especially as charge injection materials and/or charge transporting materials.

22 Claims, No Drawings

ORGANIC ELECTRONIC DEVICES

RELATED APPLICATIONS

This application is a national stage application (under 35 U.S.C. 371) of PCT/EP2005/004803 filed May 3, 2005, which claims benefit of German application 10 2004 021 989.3 filed May 4, 2004.

The present invention describes the use of certain compounds in organic electronic devices.

The use of organic semiconductors has been reality for some time, or is expected in the near future, in a number of different applications which can be ascribed to the electronics industry in the broadest sense.

The use of semiconducting organic compounds which are capable of the emission of light in the visible spectral region is just at the beginning of the market introduction, for example in organic electroluminescent devices. The market introduction for simple devices containing OLEDs has already taken place, as confirmed by the car radios from Pioneer, the mobile telephones from Pioneer and SNMD or a digital camera from Kodak with an "organic display". Further products of this type are just about to be introduced. Organic solar cells (O-SCs), organic field-effect transistors (O-FETs), organic thin-film transistors (O-TFTs), organic integrated circuits (O-ICs), organic optical amplifiers or organic laser diodes (O-lasers) are well advanced at a research stage and could achieve major importance in the future.

The general structure of organic electroluminescent devices (OLEDs) is described, for example, in U.S. Pat. Nos. 4,539,507, 5,151,629, EP 0676461, WO 98/27136, EP 423283 and WO 04/058911, where these devices usually consist of a plurality of layers. Organic solar cells (for example WO 98/48433, WO 94/05045), organic field-effect transistors (for example U.S. Pat. Nos. 5,705,826, 5,596,208, WO 00/42668), organic thin-film transistors, organic integrated circuits (for example WO 95/31833, WO 99/10939), organic optical amplifiers or organic laser diodes (for example WO 98/03566) have a similar general structure.

However, there are still considerable problems which require urgent improvement:
1. The efficiency has been improved in recent years, but is still too low, especially in fluorescent OLEDs, and has to be improved further.
2. The operating voltage is fairly high, especially in fluorescent OLEDs, and therefore has to be reduced further in order to improve the power efficiency. This is of major importance for mobile applications in particular.
3. The operating current has likewise been reduced in recent years, but must be reduced still further in order to improve the power efficiency.
4. The operating lifetime of the electronic devices is still short, and consequently it has only been possible to achieve simple applications commercially to date.

The problems described above of currently available OLEDs are caused to a substantial extent by inadequate charge-injection, charge-transport and matrix materials. The hole-injection material (HIM) or hole-transport material (HTM) used in fluorescent and phosphorescent electroluminescent devices is essentially CuPc (copper(II) phthalocyanine), PEDOT (poly(3,4-ethylenedioxy-2,5-thiophene)) or PANI (polyaniline). CuPc is generally applied to the anode here as hole-injection layer by evaporation in a high vacuum. It has been found in practice that sufficiently thin and homogeneous CuPc layers can only be produced reproducibly with difficulty via a process of this type. Layer-thickness variations usually result in short circuits here and consequently in destruction of the device. In addition, CuPc has a very high vapour-deposition temperature, typically above 400° C., meaning that the radiant heat occurring during evaporation deforms thermally sensitive positioning elements, such as suspensions of shadow masks and shadow masks themselves, which can result in imaging defects in the structuring process. By contrast, the polymeric hole-injection materials PEDOT and PANI are applied to the anode from aqueous solution by spin-coating or printing processes (for example ink-jet printing). PEDOT and PANI are strongly acidic polyelectrolytes which only develop their (semi)conducting properties through the action of a strong Brönsted acid on the organic polymer. The action of equimolar to superequimolar amounts of acid per thiophene or aniline polymer recurring unit causes the strongly acidic reaction of the aqueous polymer dispersions, which is typically at pH=1. In practice, this results not only in corrosion on the processing equipment (for example print heads), but also, in particular, in damage in the device itself, where migration of the protons in the strong electric field of an OLED in operation is being discussed here as a possible degradation mechanism. This migration of protons is thought to be particularly pronounced compared with the migration of significantly larger ions.

The arguments presented above give grounds for improving the known hole-injection and hole-conduction materials. pH-neutral materials which can be processed from aqueous solution are to the fore here.

Surprisingly, it has now been found that inclusion compounds can be used very well as charge-injection, charge-transport, matrix and electrode materials in organic electronic devices, such as, for example, fluorescent and phosphorescent electroluminescent devices, organic transistors, organic integrated circuits, organic laser diodes, or as charge-generation materials in organic solar cells and organic photoreceptors.

The use of certain inclusion compounds consisting of a light-emitting guest—in particular a transition-metal complex—in certain host molecules—in particular cyclodextrins, RNA and DNA—is described in the application U.S. 2003/0181694. The OLEDs produced using these light-emitting inclusion compounds exhibit very poor performance data compared with OLEDs which conform to the prior art. In particular, the photometric efficiencies are low in combination with very high operating voltages, which results in even worse power efficiencies. In addition, the cited application makes no mention of the lifetime of the test devices produced, a central point in OLED development. GB 2357180 describes compounds which comprise organic fluorescent dyes included in cyclodextrins. These are used as colour conversion filters in organic electroluminescent devices. The use as charge-injection and/or -transport layer is not described.

The invention accordingly relates to organic electronic devices comprising one or more inclusion compounds, characterised in that the inclusion compound is not or not directly involved in light emission.

In accordance with the above, the inclusion compounds comprise no light-emitting substances.

According to a description in the literature (Römpp Lexikon Chemie [Römpp's Lexicon of Chemistry], version 2.0, Stuttgart/N.Y.: Georg Thieme Verlag 1999), inclusion compounds are in the broadest sense molecular addition compounds which are essentially bonded to one another via dipole-dipole, dipole-induced dipole and Van der Waals forces, where one partner—the so-called host molecule—surrounds the other—the so-called guest molecular. In accordance with the spatial structure, this class of compounds can be differentiated into those which form a three-dimensional space lattice (cage inclusion lattice), those which tend to form a three-dimensional molecular lattice consisting of individual, stoichiometrically strictly defined inclusion compounds, and those which form a more two-dimensional structure (channel inclusion lattice). Typical examples of representatives of these sub-groups are clathrates (cage inclusion compounds), cyclodextrin/iodide inclusion compounds (three-dimensional lattice comprising discrete units) and amylose/iodide inclusion compounds (channel inclusion lattice).

Organic electronic devices containing inclusion compounds as charge-injection, charge-transport, charge-generation, matrix and/or electrode material are of major advantage, as described in more detail below.

Organic electronic devices preferably contain the inclusion compounds as charge-generation materials.

For the purposes of the invention, charge generation means:
1. The absorption of at least one photon which results in an excited state (exciton), and
2. Relaxation of the excited state together with an adjacent molecule with a quantum yield<1 in two oppositely charged molecular ions (of the same type or different; idealised as free-radical cation and free-radical anion), and
3. Dissociation, which is promoted through the choice of two different electrodes, since these give rise to a built-in E field.
4. Energy transfer to adjacent or more remote molecules, which may be of the same type or different, may also occur between 1 and 2 (~diffusion).

Besides the usual organic thin-film solar cells, this is explicitly also taken to mean so-called Grätzel cells, which are described, inter alia, in the applications EP 00850492, EP 00968175, U.S. Ser. Nos. 06/335,480 and 06/211,369.

Preference is likewise given to organic electronic devices which contain inclusion compounds as charge-injection and/or charge-transport materials.

A particularly preferred embodiment are organic electronic devices containing inclusion compounds as hole-injection and/or hole-transport materials.

This preference results from the observation that suitable inclusion compounds can be reversibly oxidised particularly well.

Preference is likewise given to organic electronic components, characterised in that the inclusion compounds have a low-molecular-weight compound having a defined empirical formula as host molecule.

For the purposes of this application, a low-molecular-weight compound is intended to be taken to mean a host compound having a molecular weight of less than 20,000 g/mol, preferably less than 10,000 g/mol, having a uniform molecular structure.

The host molecule of the inclusion compound is particularly preferably selected from the group of the macrocycles, macrocarbocycles, crown ethers, cryptands, cyclodextrins, cyclophanes, calixarenes, depsides, depsipeptides, macrolactones, cyclopeptides and resorcinolarenes.

Examples of host compounds of the above-mentioned types and inclusion compounds derived therefrom have been described in the literature and are incorporated here as part of this application by way of reference (B. Dietrich, P. Viout, J.-M. Lehn, Macrocyclic Chemistry, VCH Verlagsgesellschaft mbH, Weinheim, N.Y., Basel, Cambridge, 1993).

Particular mention should be made here of inclusion compounds comprising Schradinger's α-, β- and γ-cyclodextrins and polyiodide ions, which are incorporated into this application by way of reference (Cramer, Chem. Ber., 9, 855, 1951). Inclusion compounds of this type can be employed extremely well for the functions described above.

Preference is likewise given to inclusion compounds, characterised in that the host molecule of the inclusion compound is taken from the group of the oligomers and/or polymers.

These oligomers or polymers may be linear or branched. Dendrimers are oligomers for the purposes of this application.

These host molecules of the inclusion compound can be taken from the group of the synthetic oligomers and/or polymers or from the group of the natural oligomers and/or polymers (biooligomers, biopolymers).

Preferred inclusion compounds have, as host molecule, a synthetic oligomer or polymer selected from the group of the organic polymers, while inorganic polymers, for example polysiloxanes and polyphosphates, appear less suitable. From the group of the organic polymers, those having pure carbon chains are less suitable than those having a mixed carbon/heteroatom main chain. Representatives of the first group may comprise aromatic structural elements, such as, for example, the polyphenylenes, poly-para-phenylenevinylenes, polythiophenes, polypyrroles, polyketones, polycarbazoles, poly(meth)acrylamide, which may also be in N-alkyl-substituted form, polyacrylic acid, polyvinylsulfonic acid, polystyrenesulfonic acid, poly(anetholsulfonic acid), poly(anilinesulfonic acid), poly(allylamine), polyvinyl ether and oxidised and sulfonated polyolefins, as well as olefin copolymers copolymerised with maleic anhydride, CO or $SO_2$. In this group of the pure carbon chain polymers, preference is given to poly(N-vinylpyrrolidone), polyvinyl acetate and polyvinyl alcohol, both as homopolymers and also as binary and ternary copolymers, which are obtainable by (partial) hydrolysis of poly(vinylpyrrolidone-co-vinyl acetate). Representatives of the second group are poly(thio) ethers, such as poly(2,6-dimethyl-p-phenylene oxide) or polyepichlorohydrin, polyesters, polycarbonates, polylactones, polyamides, polylactams, polyimides, polyethylenimines, polyisonitriles, polyisocyanates or polyurethanes, to mention but a few. All these polymers should basically also be regarded as suitable in the form of their mixed types and copolymers. In this group, preference is given to polymers having a helical structure which comprise chiral monomers, or have syndiotactic or isotactic regularity (tacticity) induced by chiral groups, which are incorporated temporarily or remain permanently in the polymer. These also include regioregular polymers of this type, which are obtainable in the presence of chiral initiators, catalysts, additives or solvents (sergeants-and-soldiers effect).

Likewise preferred inclusion compounds have, as host molecule, a natural, nature-identical or nature-similar oligomer or polymer which is taken from the group of the lignins, tannins, oligo- and/or polysaccharides, oligo- or polypeptides, isocyano-peptides, RNA or DNA, each of which may also be synthetically modified.

Particular preference is given to organic electronic devices containing inclusion compounds which comprise, as host molecule, an oligomer or polymer from the group of the glycogens, cellulose, modified cellulose, hydrate cellulose, starch, modified starch, amylose, modified amylose, amylopectin and/or modified amylopectin.

The above-mentioned natural or synthetic polymers may be linear or branched.

Very particular preference is given to natural or synthetic polymers which have a helical structure.

The host molecules of the inclusion compound may be soluble or swell in organic solvents and/or water.

Preference is given to the use of water as solvent or dispersion medium for the host molecules and inclusion compounds since systems which can be processed particularly well are obtained in this way. In addition, these water-based systems have a considerable ecological advantage over the systems based on organic solvents. A further advantage of aqueous or water-based solvents is that the subsequent layer can generally be applied from organic solvents without the underlying layer thereby detaching.

As guest of the inclusion compound, preference is given to inorganic compounds, where the guest may be a neutral compound or ionic.

It should explicitly be pointed out at this point that this does not exclude the use of inclusion compounds consisting of a host and an organic guest.

Preference is given to inclusion compounds, characterised in that polyanions are used as guest of the inclusion compound.

Particular preference is given to inclusion compounds, characterised in that polyhalide anions are used as guest of the inclusion compound.

Polyhalide anions here are taken to mean anions of the $X_n^-$ and $XY_n^-$ type, where X and Y are elements from the 7th main group, i.e. fluorine, chlorine, bromine or iodine. Typical examples which may be mentioned are $I_2Br^-$, $I_2Cl^-$, $I_3^-$, $I_5^-$, $I_7^-$, $I_9^-$, $Br_3^-$ or also $Cl_3^-$, without wishing to restrict the invention thereto.

In addition, X and Y are also taken to mean, for the purposes of this application, further simple ions, preferably with a linear structure, such as, for example, the pseudohalide ions $CN^-$, $SCN^-$, $OCN^-$, $CNO^-$.

Very particular preference is given to inclusion compounds which have polyiodide anions as guest of the inclusion compound. Polyiodide ions have the formula $I_n^-$, where n is a natural number greater than two.

Further polyhalides of this type are indicated, inter alia, in the following literature, which is incorporated into this application by way of reference (Naturwissenschaften 71, 31, 1984; Angew. Chem. 107, 2563, 1995; L. Stein, Halogen. Chem. 1, 133, 1967; J. E. Huheey, Anorganische Chemie, Walter de Gruyter, Berlin, N.Y., 1988).

Particular preference is given to organic electronic devices containing inclusion compounds which consist of polyhalide ions, as described above, incorporated into a natural, nature-identical or nature-similar oligomer or polymer selected from the group of the oligo- and/or polysaccharides, oligo- or polypeptides, RNA or DNA, in particular the group of the oligo- and/or polysaccharides, each of which may also be synthetically modified.

Very particular preference is given to organic electronic devices containing inclusion compounds which consist of polyiodide ions (guest), incorporated into the helical structure of amylose (host), and non-included countercations, where they serve, in particular, as hole-injection and/or hole-transport layer in organic electroluminescent devices or as charge-generation materials in organic solar cells.

In a further embodiment, the inclusion compounds may carry in the periphery organic groups which can be crosslinked by means of a thermally or photochemically induced concerted, free-radical, anionic, cationic or cationic ring-opening reaction. In addition, crosslinking using transition-metal catalysts is possible, for example in the form of transition metal-catalysed olefin metathesis. In this case, inclusion compounds can be crosslinked in solution or dispersion or alternatively in the layer already applied from solution or dispersion. Typical crosslinkable groups are olefins (for example vinyl groups, allyl groups, acrylonitriles, acrylates, acryl-amides), dienophiles and enophiles, which can be brought to reaction in a Diels-Alder reaction, cyclic ethers (for example oxirane, oxetane, tetrahydrofuran, pyran, dioxane), as well as the corresponding sulfur derivatives, cyclic acetals (for example 1,3-dioxolane, 1,3-dioxepan, trioxane), lactones, cyclic carbonates, but also cyclic structures which contain various heteroatoms in the ring, such as, for example, oxazolines, dihydrooxazines or oxazolones, cyclic amines, such as aziridines, or a combination of olefins and ketones, which can be brought to reaction with one another in a Paterno-Büchi reaction.

The crosslinking can likewise take place via a polycondensation reaction, for example via a polyester formation, a polyamide formation, a polysiloxane formation or a polyaryl formation via the Suzuki reaction, to mention but a few of the innumerable possibilities familiar to the person skilled in the art.

Charged inclusion compounds, irrespective of the type, have, as counterions, inorganic or organic, simple (for example alkali metal, alkaline earth metal or transition-metal ions) or composite ions (for example tetraalkyl- or tetraarylammonium, -phosphonium, trialkyl- or triaryloxonium, -sulfonium, tetrafluoroborate, tetraarylborate, hexafluorophosphate, etc.) or oligomeric or polymeric (for example polystyrylsulfonate) ions. If desired, the composite, oligomeric or polymeric ions may also carry in the periphery organic groups which can be crosslinked by means of a thermally or photochemically induced concerted, free-radical, anionic, cationic or cationic ring-opening reaction. Thus, either a crosslinked counterion can be produced or a charged inclusion compound can be crosslinked with its counterion.

The above-mentioned crosslinking is also suitable in principle for the structuring of charge-injection, charge-transport and charge-generation layers, for example by photolithographic or related processes.

In the case of the organic electronic devices described above containing at least one inclusion compound, preference is given to those in which at least one layer has been applied by means of a sublimation process. In this, the materials are vapour-deposited in vacuum sublimation units at a pressure of less than $10^{-5}$ mbar, preferably less than $10^{-6}$ mbar, particularly preferably less than $10^{-7}$ mbar.

Preference is likewise given to an organic electronic device, characterised in that one or more layers are applied by means of the OVPD (organic vapour phase deposition) process or with the aid of carrier-gas sublimation.

Preference is likewise given to organic electronic devices containing at least one inclusion compound in which one or more layers have been produced from solution, such as, for example, by spin coating, or by means of any desired printing process, such as, for example, screen printing, flexographic printing or offset printing, but particularly preferably LITI (light induced thermal imaging, thermotransfer printing) or ink-jet printing.

Preference is furthermore given to organic electronic devices containing at least one inclusion compound in which the inclusion compound additionally serves as polariser.

Besides charge-transport layers, OLEDs in accordance with the prior art usually also contain polarisers, which serve to reduce undesired reflections of the metallic-lustrous cathode and furthermore to promote light emission which is substantially independent of the viewing angle. These polarisers typically consist of standard polarising foils, applied from the outside by lamination to the transparent substrate of the OLED. However, they have the disadvantage of having a transmission of typically only about 50-60%, meaning that a not inconsiderable amount of light is lost during output. Naturally, this applies in a similar manner to the charge-injection and charge-transport layers used, i.e. also to the hole-injection layers applied to a transparent anode (for example ITO).

A particular advantage of the organic devices containing inclusion compounds described here is that the hole-injection layer (HIL) and polarising foil functional layers, which are implemented separately in OLEDs in accordance with the prior art, can be combined in a single layer. The polarising action of inclusion compounds, particularly of the iodine-containing inclusion compounds, is known (Z. K. Kalayjian, A. G. Andreou, L. B. Wolff, N. Sheppard, IMEC Conference, Belgium, 1996, 171); this invention relates, as stated above, to their hole-transport properties. The use of iodine-containing inclusion compounds in polyvinyl alcohols or sugar derivatives, such as cellulose or amylose, etc., is particularly preferred here.

The combination of two layers of a conventional OLED in a single hole-injecting or hole-conducting and simultaneously polarising layer according to the invention considerably increases the light output efficiency. The orientation of the inclusion compound for the generation of polarising properties can be carried out by methods familiar to the person skilled in the art, preferably by mechanical influences, for example by knife coating or the action of shear forces and shear dilution, such as, for example, brushes with rollers whose tangential velocity has a slip to the linear velocity of the substrate, and by rubbing with a fleece, non-woven fabric or woven fabric, such as, for example, velvet. These brushes may contain natural or synthetic fibres. Preference is given to carbon fibres. The layer to be oriented can be a wet film or dry film; preference is given to an intermediate state of drying, which is additionally oriented by means of a stream of gas from the side. Also suitable is the use of pre-structured surfaces for the orientation of the inclusion compound, as described, for example, in U.S. Pat. No. 3,941,901 for LCD-like polyimide alignment layers.

The organic electronic device containing inclusion compounds is particularly preferably organic light-emitting diodes, organic solar cells, organic transistors, organic integrated circuits, organic laser diodes or organic photoreceptors.

The emitting devices described above have the following surprising advantages over the prior art:

1. The efficiency of corresponding devices becomes higher compared with systems which, in accordance with the prior art, contain PEDOT, PANI or oligomeric, polymeric or dendritic arylamines as hole-injection material and/or hole-conductor material.
2. The stability of corresponding devices remains unchanged or becomes higher compared with systems which, in accordance with the prior art, contain PEDOT, PANI or oligomeric, polymeric or dendritic arylamines as hole-injection material and/or hole-conductor material.
3. Since the inclusion compounds are generally not oxidation-sensitive, they can be processed as hole-injection material and/or hole-conductor material more easily and with less technical effort than comparable oligomeric, polymeric or dendritic arylamines.
4. Many of the inclusion compounds indicated above can be prepared simply from readily accessible materials. In addition, the use of natural raw materials, such as, for example, starch, is resource-conserving.
5. Many of the inclusion compounds indicated above can be provided with polarising properties by structuring, so that, besides the charge-injection, charge-transport and matrix functions, they additionally act as polariser in the organic electronic devices.

The present application text and also the further examples below are directed in particular to organic light-emitting diodes and the corresponding displays. In spite of this restriction of the description, it is possible for the person skilled in the art, without further inventive step, also to use the inclusion compounds described for other, related devices, for example for organic solar cells, organic thin-film transistors, organic field-effect transistors or also organic laser diodes, to mention but a few further applications.

EXAMPLES

Preparation of the Inclusion Compounds:

The following syntheses were—unless indicated otherwise—carried out under a protective-gas atmosphere. The starting materials were purchased from ALDRICH [solvents, iodine, potassium iodide, tetrabutylammonium iodide]. The starch used was the water-soluble part of potato starch, marketed by Unilever under the trade name Mondamin.

Example 1

HIL1 ($I_2$/iodide=1:1, counterion potassium)

5.0 g of starch were suspended in 200 ml of distilled water. The suspension was warmed for 2 h at 90° C., during which a clear solution which was slightly opalescent in transmitted light formed. A solution of 0.254 g (1 mmol) of iodine and 0.166 g (1 mmol) of potassium iodide in a mixture of 50 ml of distilled water and 100 ml of ethanol was slowly added dropwise to this solution at 90° C. The mixture, which was dark-blue after the addition was complete, was allowed to cool to room temperature over the course of 16 h. It was subsequently filtered through a 1 μ filter. The mixture obtained in this way was then employed for coating as described below.

Example 2

HIL2 ($I_2$/iodide=2:1, counterion potassium)

Procedure analogous to Example 1. 0.508 g (2 mmol) of iodine and 0.166 g (1 mmol) of potassium iodide were employed.

Example 3

HIL3 ($I_2$/iodide=3:1, counterion potassium)

Procedure analogous to Example 1. 0.761 g (3 mmol) of iodine and 0.166 g (1 mmol) of potassium iodide were employed.

Example 4

HIL4 ($I_2$/iodide=2:1, counterion tetrabutylammonium)

Procedure analogous to Example 1. 0.508 g (2 mmol) of iodine and 0.370 g (1 mmol) of tetrabutylammonium iodide were employed.

Example 5

Use of the Inclusion Compounds as Hole-Injection Material

OLEDs were produced by a general process in accordance with WO 05/003253 or WO 04/058911, which had to be adapted in individual cases to the respective circumstances (for example layer-thickness variation in order to achieve optimum efficiency or colour).

The results for various OLEDs are presented in the following examples. The basic structure, the materials and layer thicknesses used, apart from the hole-injection layer, were identical for better comparability. OLEDs having the following structure were produced analogously to the above-mentioned general process:

- Hole-injection layer (HIL) 60 nm of the hole-injection materials HIL1 to HIL4 according to the invention in accordance with Examples 1 to 4 (spin-coated and dried at 100° C., 10 min.),
- or as reference 60 nm of PEDOT (poly(3,4-ethylenedioxy-2,5-thiophene), purchased from H. C. Starck, spin-coated from water and dried at 100° C., 10 min.)
- Hole-transport layer (HTL) 20 nm of NaphDATA (vapour-deposited; purchased from SynTec; 4,4',4''-tris(N-1-naphthyl-N-phenylamino)-triphenylamine)
- Hole-transport layer (HTL) 20 nm of S-TAD (vapour-deposited; prepared in accordance with WO 99/12888; 2,2',7,7'-tetrakis-(diphenyl-amino)spiro-9,9'-bifluorene)
- Emission layer (EML) EML-F=fluorescent OLED: Spiro-DPVBi (prepared in accordance with WO 02/10093, 2,2',7,7'-tetrakis(2,2'-diphenylvinyl)spiro-9,9=-bifluorene)
  - EML-P=phosphorescent OLED:
  - Matrix material M1 (prepared in accordance with WO 04/093207, bis(9,9'-spirobifluoren-2-yl)ketone) doped with 10% of Ir(PPy)$_3$ (prepared in accordance with WO 02/060910)
- Electron conductor (ETC) 20 nm (vapour-deposited: AlQ$_3$ purchased from SynTec; tris(quinolinato)aluminium (III))
- Ba/Al (cathode) 3 nm Ba, 150 nm Al on top These as yet unoptimised OLEDs were characterised by standard methods; to this end, the electroluminescence spectra, the efficiency (measured in cd/A), the power efficiency (measured in lm/W) as a function of the brightness and current/voltage/brightness characteristic lines (IUL characteristic lines) were determined.

Table 1 and Table 2 show the results of some examples, where in each case the composition of the HIL including the layer thicknesses is also shown. The HILs comprise, for example, compounds HIL1 to HIL4 in accordance with Examples 1 to 4 as hole-injection material. OLEDs in accordance with the prior art which comprise PEDOT as HIL serve as comparative examples. For better clarity, the corresponding structural formulae of the substances used are shown below.

TABLE 1

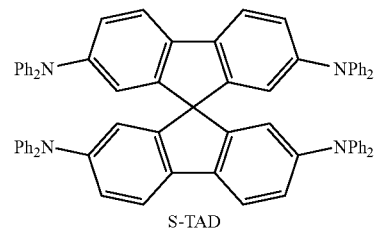

S-TAD

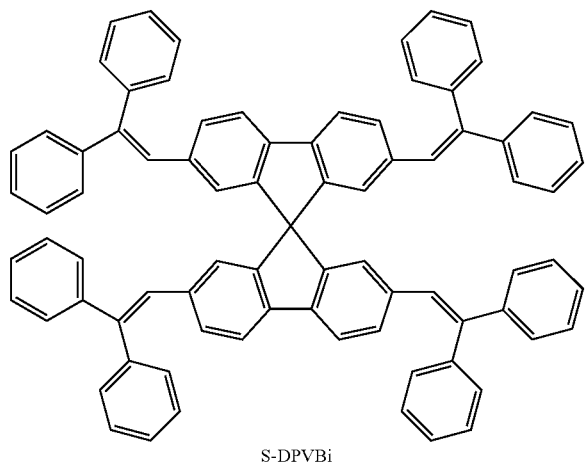

S-DPVBi

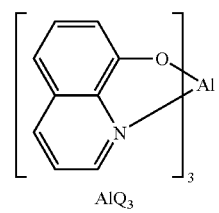

AlQ$_3$

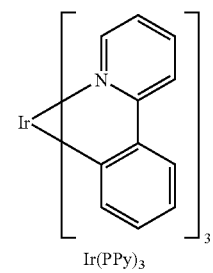

Ir(PPy)$_3$

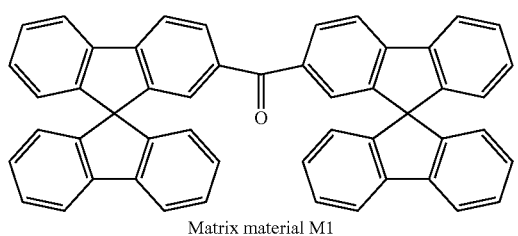

Matrix material M1

Fluorescent OLEDs

| Example | HIL | EML-F | U [V] at 100 cd/m$^2$ | Max. efficiency [cd/A] | CIE (x, y) |
|---|---|---|---|---|---|
| Example 6 (comparison) | PEDOT (60 nm) | S-DPVBi (30 nm) | 5.2 | 3.7 | 0.17/0.24 |
| Example 7 | HIL1 (60 nm) | S-DPVBi (30 nm) | 4.7 | 4.4 | 0.17/0.22 |

TABLE 1-continued

| Example 8 | HIL2<br>(60 nm) | S-DPVBi<br>(30 nm) | 4.5 | 4.1 | 0.17/0.22 |
| --- | --- | --- | --- | --- | --- |
| Example 9 | HIL4<br>(60 nm) | S-DPVBi<br>(30 nm) | 4.6 | 4.4 | 0.18/0.22 |

All fluorescent OLEDs (Examples 6 to 9) exhibit blue emission which originates from the fluorescent emitter S-DPVBi. The highest photometric efficiencies are obtained in devices in which the hole-injection material PEDOT has been replaced by hole-injection materials HIL1 to HIL4 according to the invention (see Examples 7-9). In addition, these examples exhibit lower operating voltages at an operating brightness of 100 cd/m$^2$, which is reflected in a correspondingly greater power efficiency.

TABLE 2

Phosphorescent OLEDs

| Example | HIL | EML-P | U [V]<br>at 100<br>cd/m$^2$ | Max.<br>efficiency<br>[cd/A] | CIE (x, y) |
| --- | --- | --- | --- | --- | --- |
| Example 10<br>(comparison) | PEDOT<br>(60 nm) | M1/Ir(PPy)$_3$<br>(30 nm) | 4.0 | 35 | 0.38/0.59 |
| Example 11 | HIL1<br>(60 nm) | M1/Ir(PPy)$_3$<br>(30 nm) | 3.8 | 41 | 0.37/0.58 |
| Example 12 | HIL3<br>(60 nm) | M1/Ir(PPy)$_3$<br>(30 nm) | 3.9 | 40 | 0.37/0.58 |
| Example 13 | HIL4<br>(60 nm) | M1/Ir(PPy)$_3$<br>(30 nm) | 3.5 | 44 | 0.37/0.59 |

In summary, it can be stated that OLEDs comprising inclusion compounds as HIL have a higher efficiency at lower voltages, as can easily be seen from Tables 1 and 2. In addition, the lifetime of the devices according to the invention is longer than that of the devices in accordance with the prior art.

The invention claim is:

1. Organic electronic device comprising one or more inclusion compounds, wherein the inclusion compound is not or not directly involved in light emission and is used as charge-injection and/or charge-transport material and wherein the inclusion compound represents a host molecule surrounding a guest molecule and wherein the electronic device is an organic light-emitting diode.

2. Organic electronic device according to claim 1, wherein the inclusion compound is used as hole-injection and/or hole-transport material.

3. Organic electronic device according to claim 1, wherein the inclusion compound has a low-molecular-weight compound having a defined empirical formula as host molecule.

4. Organic electronic device according to claim 3, wherein the host molecule of the inclusion compound is a macrocycle, a macrocarbocycle, a crown ether, a cryptand, a cyclodextrin, a cyclophane, a calixarene, a depside, a depsipeptide, a macrolactone, a cyclopeptide or a resorcinolarene.

5. Organic electronic device according to claim 1, wherein the host molecule of the inclusion compound is taken from the group of the oligomers and/or polymers.

6. Organic electronic device according to claim 5, wherein the host molecule of the inclusion compound is taken from the group of the synthetic oligomers and/or polymers.

7. Organic electronic device according to claim 6, wherein the host molecule of the inclusion compound is a polyphenylene, a poly-para-phenylenevinylene, a polyether, a polyester, a polyamide, a polyketone, a polycarbazole, a polyvinyl alcohol, a polyvinyl ether or a polyurethane.

8. Organic electronic device according to claim 5, wherein the host molecule of the inclusion compound is taken from the group of the natural oligomers and/or polymers, which may also be synthetically modified.

9. Organic electronic device according to claim 8, wherein the host molecule of the inclusion compound is taken from the group of the oligo- and/or polysaccharides, the oligo- and/or polypeptides, RNA or DNA.

10. Organic electronic device according to claim 9, wherein the inclusion compound host molecule used is a glycogen, cellulose, modified cellulose, hydrate cellulose, starch, modified starch, amylose, modified amylose, amylopectin and/or modified amylopectin.

11. Organic electronic device according to claim 3, wherein the host molecule of the inclusion compound is soluble or swells in organic solvents and/or water.

12. Organic electronic device according to claim 1, wherein the guest molecule of the inclusion compound is an inorganic compound.

13. Organic electronic device according to claim 12, wherein the guest molecule of the inclusion compound is a polyanion.

14. Organic electronic device according to claim 12, wherein the guest molecule of the inclusion compound is a polyhalide anion.

15. Organic electronic device according to claim 14, wherein the guest molecule of the inclusion compound is a polyiodide anion.

16. Organic electronic device according to claim 1, wherein the inclusion compound consists of polyhalide ions incorporated into a natural, nature-identical or nature-similar oligomer or polymer selected from the group of the oligo- and/or polysaccharides, oligo-or polypeptides, RNA or DNA, each of which may also be synthetically modified.

17. Organic electronic device according to claim 16, characterised in that the inclusion compound consists of polyiodide ions incorporated into the helical structure of amylose, and a counterion.

18. Organic electronic device according to claim 17 wherein the inclusion compound is used in a hole-injection and/or hole-transport layer.

19. Organic electronic device according to claim 1, wherein one or more layers are applied by means of a sublimation process.

20. Organic electronic device according to claim 1, wherein one or more layers are applied by means of the OVPD (organic vapour phase deposition) process or with the aid of carrier-gas sublimation.

21. Organic electronic device according to claim 1, wherein one or more layers are produced from solution or by means of a printing process.

22. Organic electronic device according to claim 1, wherein the layer comprising the inclusion compound additionally serves as polariser.

* * * * *